United States Patent [19]

Tam

[11] Patent Number: 4,606,643
[45] Date of Patent: Aug. 19, 1986

[54] FINE ALIGNMENT SYSTEM

[75] Inventor: Wai-Ming Tam, Danbury, Conn.

[73] Assignee: The Perkin-Elmer Corporation, Norwalk, Conn.

[21] Appl. No.: 505,592

[22] Filed: Jun. 20, 1983

[51] Int. Cl.$^4$ ............................................. G01B 11/00
[52] U.S. Cl. .................................................... 356/401
[58] Field of Search ............... 356/399, 400, 401, 138, 356/150, 153

[56] References Cited

U.S. PATENT DOCUMENTS

| 4,386,849 | 6/1983 | Haeusler et al. | 356/401 |
| 4,388,386 | 6/1983 | King et al. | 356/401 |

Primary Examiner—R. A. Rosenberger
Attorney, Agent, or Firm—Edwin T. Grimes; Thomas P. Murphy; Richard C. Wilder

[57] ABSTRACT

The present invention is directed to method and apparatus for determining the resolution and range of the mask and wafer stages and the overall accuracy in a lithographic projection system, the system including first indicia disposed on a first member, second indicia disposed on a second member, the spacing between the indicia when the indicia of the first member is projected onto the indicia of the other member coarsely indicating the degree of misalignment between the members when making a fine motion alignment measurement, a first scale disposed on the first member, a second scale disposed on the second member, each of the scales having a plurality of spaced fingers, all of the fingers being of substantially the same width, the pitch of the fingers of one scale being different than the pitch of the fingers on the other scale so that when the scale of one member is projected onto the scale of the other member the pair of fingers which coincide indicates a fine degree of fine motion alignment measurement from an alignment axis, one of the members being a test mask and the other of the members being a wafter-tool. In one form of the invention, the first member and the second member are in substantially exact alignment when a central finger of the first scale coincides with a central finger of the second scale along the alignment axis.

7 Claims, 6 Drawing Figures

FINE ALIGNMENT SYSTEM

FIELD OF INVENTION

This invention relates to method and apparatus for determining the resolution and range of the mask for wafer stages and the overlay accuracy in a lithographic projection system.

This application is closely related to U.S. Pat. No. 4,547,566 entitled: "Motion Measurement and Alignment Method and Apparatus", and is commonly assigned. The disclosure therein is incorporated herein by reference.

BACKGROUND OF THE INVENTION

A problem with projection alignment instruments has been finding a way to determine the resolution and range of the mask and wafer stages and the overlay accuracy of the instrument. This must be done within a small viewing area. Heretofore, a small vernier was used for purposes of alignment, but it was unable to measure the deviation range.

The present invention is intended to overcome the foregoing and other problems, which will become apparent as the description proceeds.

SUMMARY OF THE INVENTION

In order to accomplish the desired results, the invention provides in one form thereof a new and improved alignment system for use with lithographic projection systems which includes, in combination, first indicia disposed on a first member, second indicia disposed on a second member. When the indicia of one member is projected onto the indicia of the other member, the spacing between the indicia coarsely indicates the degree of misalignment between the members. The alignment system further includes a first scale disposed on the first member, a second or vernier scale disposed on the second member, each of the scales including a plurality of spaced fingers. All of the fingers are substantially the same width, but the pitch of the fingers of one scale is different than the pitch of the fingers on the other scale so that when the scale of one member is projected onto the scale of the other member the pair of fingers which coincide indicates a fine degree of fine motion alignment measurement from an alignment axis. In one form of the invention, the first member and the second member are in substantially exact alignment when a central finger of the first scale coincides with a central finger of the second scale along said alignment axis. Further, according to a form of the invention, the members are in substantially exact alignment when the first indicia is in alignment with the second indicia and a central finger of the first scale coincides with a central finger of the second scale along the alignment axis. One of said members is a test mask and the other of said members is a wafer tool, thereby forming a fine alignment system for a lithographic projection system.

According to an aspect of the invention, a master mask is provided for use in making a wafer-tool for testing a lithographic projection system. This mask comprises a pattern of opaque and transparent areas formed on a transparent substrate wherein one of the areas is characterized by first indicia disposed in a first location, second indicia disposed in a second location spaced a preselected distance from said first location, a first scale disposed in said first location and a second or vernier scale disposed in said second location, each of the scales including a plurality of spaced fingers. All of the fingers are substantially the same width, but the pitch of the fingers of one scale is different than the pitch of the fingers on the other scale.

According to still another aspect of the invention there is provided a method of making a wafer-tool for testing a lithographic projection system which comprises the steps of: inserting a master mask into a projection mask aligner, said mask having first indicia disposed in a first location, second indicia disposed in a second location, a first scale disposed in said first location and a second scale disposed in said second location, each of the scales including a plurality of spaced fingers, all of said fingers being of substantially the same width but the pitch of the fingers of one scale being different than the pitch of the fingers on the other scale. The method further includes the steps of inserting a photoresist-coated semiconductor wafer into said projection mask aligner, aligning said mask and wafer with respect to each other, exposing the photoresist on said wafer and chemically etching said wafer to perfect the mask pattern thereon, thereby forming a wafer tool having images of the first and second indicia and the first and second scales.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Several embodiments of the invention have been chosen for purposes of illustration and description, and are shown in the accompanying drawings, forming a part of the specification.

DETAILED DESCRIPTION OF THE PREFERRED EMBODIMENTS

Figure 1:
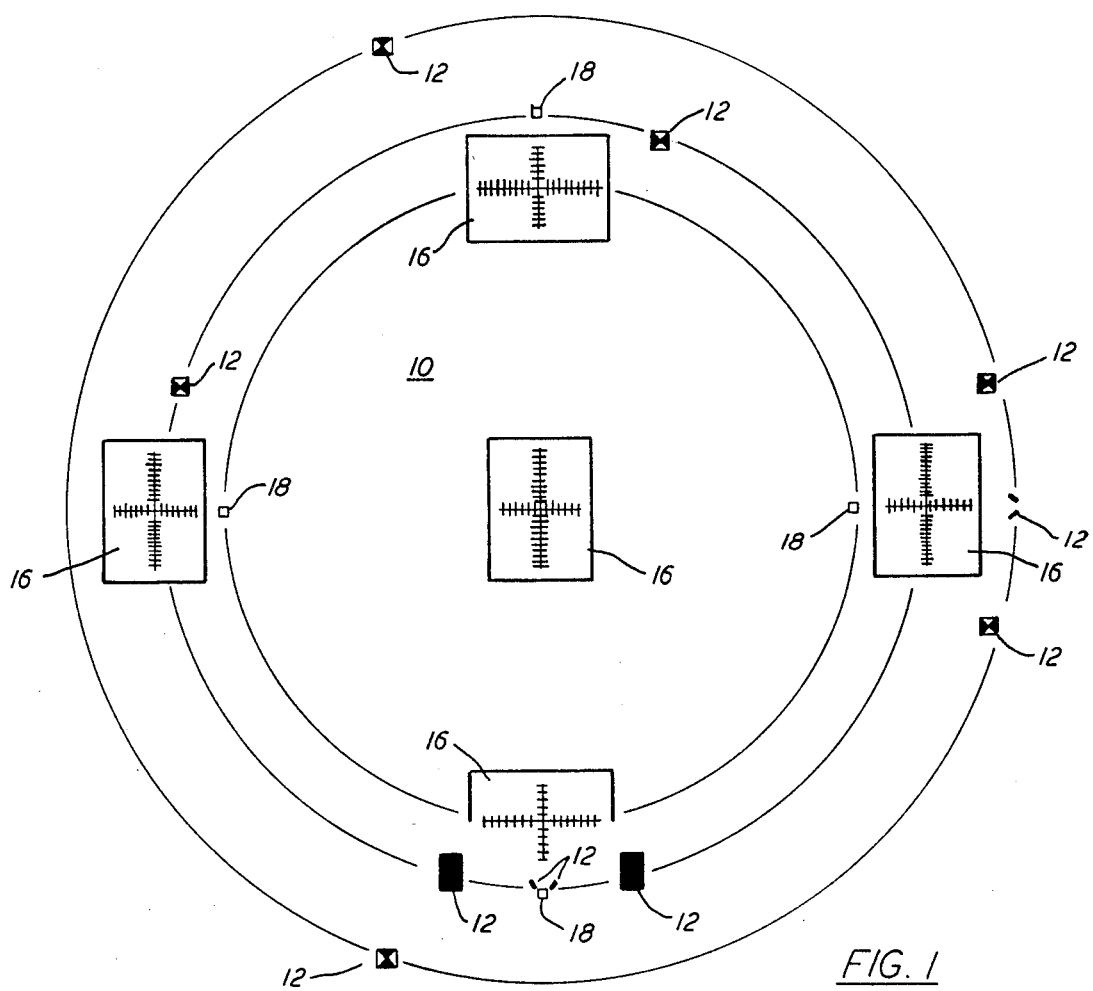
FIG. 1 is an enlarged plan view of a universal master mask having indicia thereon according to the present invention.

Referring to FIG. 1, a universal master mask 10 is illustrated, which is particularly adapted for use in making a wafer-tool for testing the resolution and range of the mask and wafer stages and the overlay accuracy in optical lithographic projection systems. This mask comprises a pattern of opaque and transparent areas formed on a transparent substrate wherein one of the areas is characterized by an alignment pattern and separate motion measurement patterns.

Figure 2:
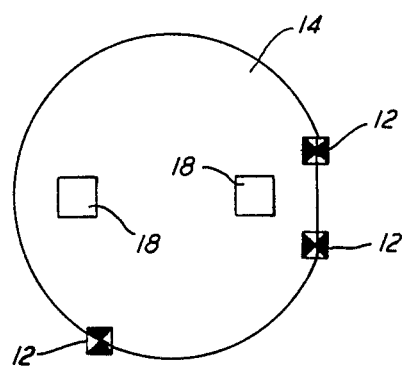
FIG. 2 is a plan view, drawn to a reduced scale, of a wafer showing indicia thereon according to the present invention.

Referring in particular to the alignment pattern on the universal master mask of FIG. 1, it will be appreciated that there are a number of different patterns presented so that a set of three or four patterns may be used to align any one of a plurality of different types of wafers. Such alignment patterns are indicated at 12 in FIG. 1, for example. FIG. 2 illustrates a wafer 14, which is one of many different types of commercially available wafers.

The master mask 10 shown in FIG. 1 is provided with coarse motion measurement patterns 16, which are used for making coarse motion measurement wafer-tools, as described in the aforementioned U.S. Pat. No. 4,547,466. In addition, the master mask 10 is provided with fine motion measurement patterns 18. To make a wafer-tool for fine stage motion measurement, the mask 10 is inserted into a projection mask aligner and the wafer 14, FIG. 2, is also inserted into the aligner. The wafer, or a previous wafer, is aligned by means of the alignment pattern 12. Then the wafer is exposed in the conventional manner to produce two fine, spaced, indicia patterns 18. Thereafter, the wafer is chemically etched to perfect the pattern thereon, thereby forming a wafer-tool having images 18 of the fine motion measurement pattern.

Figure 6:
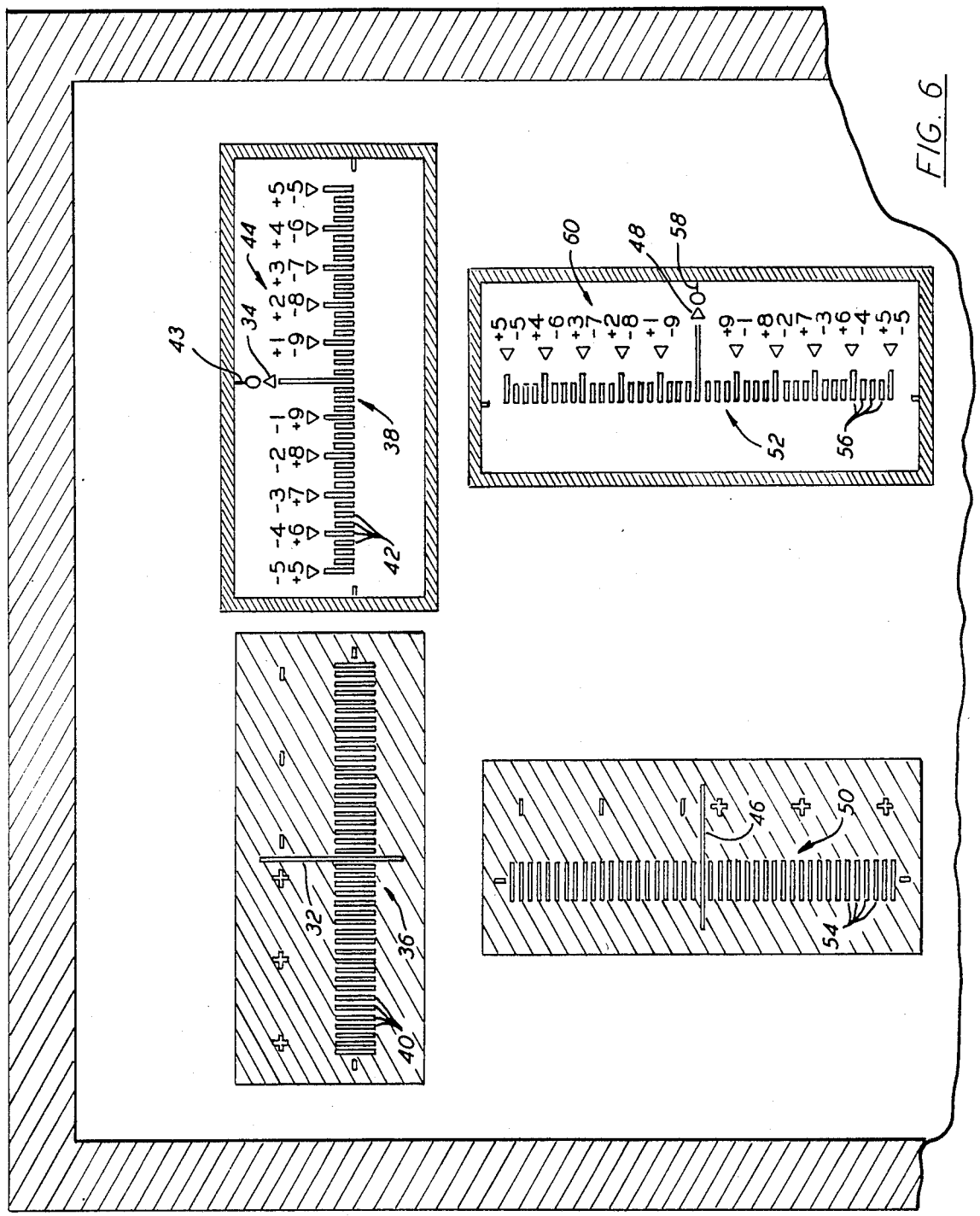
FIG. 6 is a greatly enlarged plan view of the pattern of the indicia on the master mask.

FIG. 6 illustrates a greatly enlarged view of the fine motion measurement pattern, which in practice is encompassed within each of the small areas 18, FIG. 1.

Figure 3:
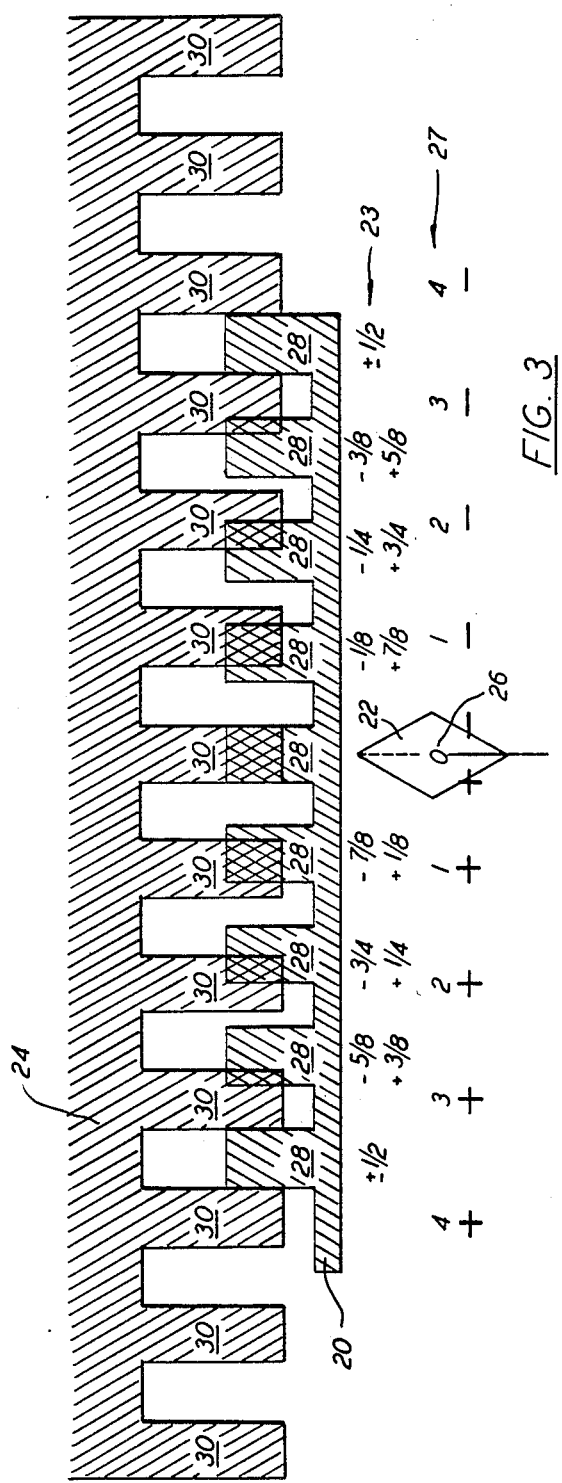
FIGS. 3-5 are plan views greatly enlarged showing the interrelationship of the patterns of the indicia on the mask and on the wafer at several simulated operative positions.
Figure 4:
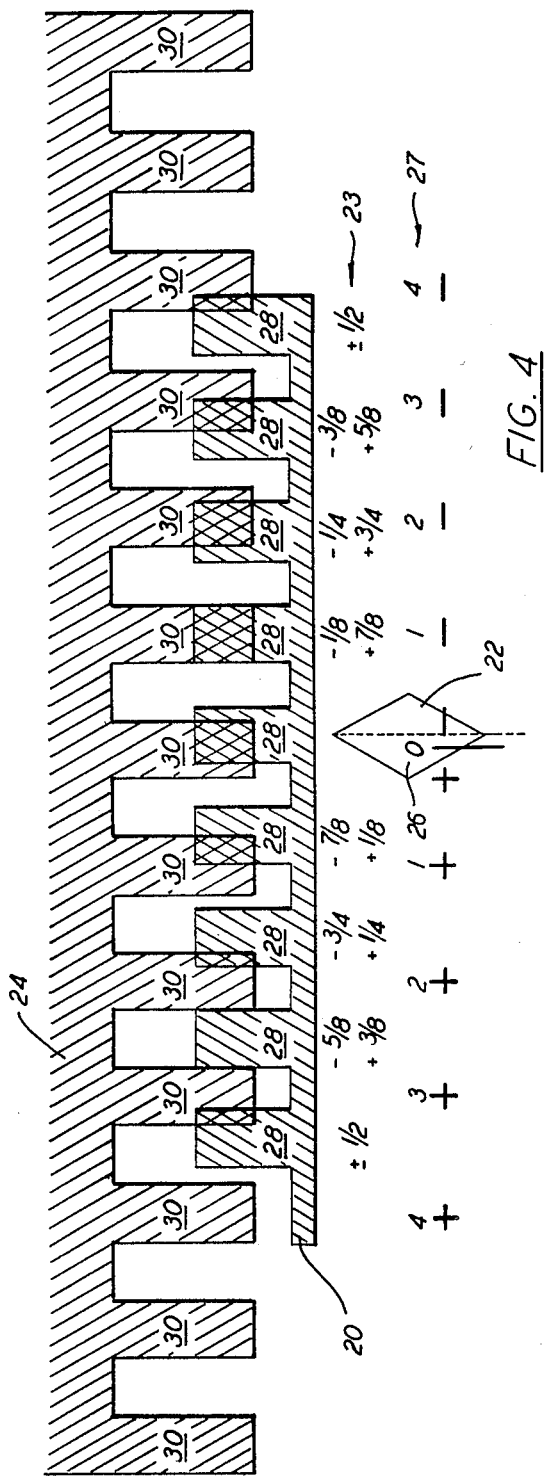
Figure 5:
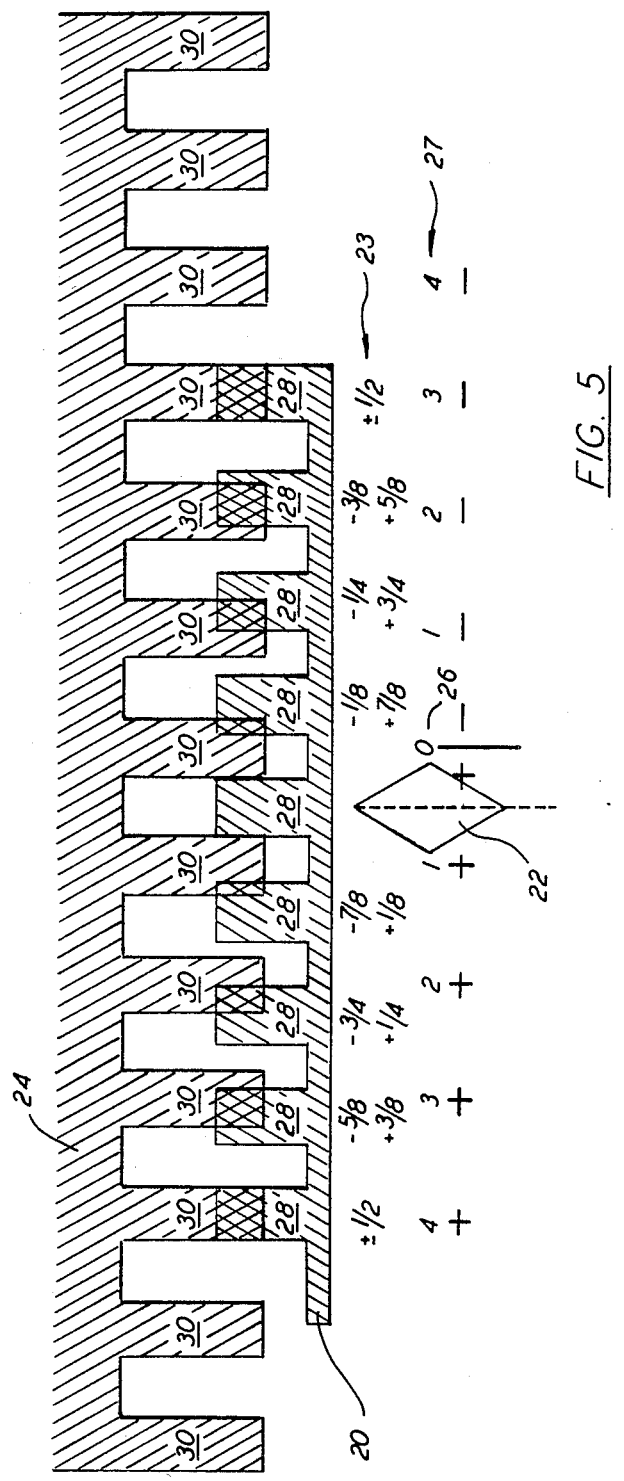

FIGS. 3–5 illustrate how the fine motion measurement pattern is used. The alignment system includes a first member 20 having first indicia thereon, which in the illustrated embodiment is a diamond with a vertical dotted line therethrough, as indicated at 22. The fraction scale indicated generally at 23 is disposed on the first member 20. It also includes a second member 24 having second indicia thereon, which in the illustrated embodiment is a small circle and a solid vertical line as indicated at 26. The number scale indicated generally at 27 is disposed on the second member 24. When the indicia 22 of one member is projected onto the indicia 26 of the other member, the spacing between the indicia as indicated by the scale 27 coarsely indicates the degree of misalignment between the members 20, 24 when making a fine motion measurement.

In addition, the first member 20 has a first scale or plurality of spaced fingers 28, and the second member 24 has a second or vernier scale in the form of a plurality of spaced fingers 30. All of the fingers 28, 30 are of substantially the same width. The pitch of the fingers of one scale is different than the pitch of the fingers on the other scale so that when the scale of one member is projected onto the scale of the other member the pair of fingers which coincide indicates a fine degree of fine motion alignment measurement from an alignment axis. In the embodiment illustrated in FIGS. 3–5, the pitch of fingers 30 is $\frac{1}{8}''$ greater than the pitch of fingers 28. The indicia 26 acts as the alignment axis in this embodiment.

More in detail, FIG. 3 shows the members 20 and 25 in substantially exact alignment. It is noted that the diamond with the dotted line 22 is in exact alignment with the circle with the solid vertical line 26. It is also noted that the fingers 28 and 30 are in alignment at the center of the scale 23. Next, referring to FIG. 4, the member 20 has been moved to the right or negative direction with respect to the ember 24. On scale 27, the diamond with the dotted line 22 appears between 0 and −1. The fingers 28 and 30 coincide at the $-\frac{1}{8}$; $+\frac{7}{8}$ point on scale 23. As a result, member 20 is indicated as being $\frac{1}{8}''$ out of alignment with member 24 in the negative direction. Now referring to FIG. 5, the member 20 has been moved to the left or positive direction with respect to the member 24. On scale 27, the diamond with the dotted line 22 appears between the 0 and the +1. The fingers 28 and 30 coincide at the $\pm\frac{1}{2}$ point on scale 23. As a result, member 20 is indicated as being $\frac{1}{2}''$ out of alignment with the member 24 in the positive direction. It will be appreciated that the first member 20 and the second member 24 are in substantially exact alignment when said first indicia 22 is in alignment with said second indicia 26 along the alignment axis which in this case is also indicated at 26 and a central finger 28 of the first scale coincides with a central finger 30 along said alignment axis 26. Thus, the alignment axis 26 distinguishes between the positive and the negative number readings, which is an important aspect of the vernier pattern of the present invention because it saves 50% of the required length of the scale to cover a specific range. This is due to the fact that a single finger indicates alignment in both a positive and a negative position. In actual operation, one of the members 20, 24 is a test mask and the other member is a wafer-tool.

Referring next to FIG. 6, there is illustrated a greatly enlarged plan view of the pattern 18 of the indicia of the master mask. As discussed hereinbefore in connection with the discussion of FIGS. 1 and 2, the image of the pattern 18 on the mask 10, FIG. 1, is formed on the wafer-tool 14, FIG. 2. The pattern 18 includes first indicia 32 in the form of an elongated vertical bar and second indicia 34 in the form of a triangle and short bar. When the indicia 32 of a first member is projected onto the indicia 34 of the second member, the spacing between said indicia coarsely indicates the degree of misalignment between said members when making a fine motion alignment measurement. It is noted that one of said members is the test mask and the other of said members is the wafer-tool.

Still referring to FIG. 6, the pattern 18 also includes a first scale indicated at 36 and a second scale or vernier indicated at 38. Each of the scales includes a plurality of spaced fingers 40 and 42, respectively, with all of the fingers being of substantially the same width. The pitch of the fingers of one scale is different than the pitch of the fingers on the other scale so that when the first scale 36 of the first member is projected onto the second scale 38 of the second member, the pair of fingers which coincide indicates a fine degree of fine motion alignment measurement from an alignment axis 43, as indicated by the number adjacent thereto on the numerical scale 44. Again, it is noted that one of said members is a test mask and the other of said members is a wafer-tool. One of the members is moved horizontally so that the first scale 36 of the first member overlays the second scale 38 of the second member. Indicia 32 and 34 and scales 36 and 38 are used to measure the horizontal deviations.

Means are also provided for measuring the vertical deviations. That is, still referring to FIG. 6, the pattern 18 includes a third indicia 46, a fourth indicia 48, a third scale 50, a fourth or vernier scale 52, spaced fingers 54 and 56, an alignment axis 58 and a numerical scale 60. These elements are constructed and function in the same manner as the corresponding elements which were discussed above in connection with the means for measuring the horizontal deviation, but are used for measuring the vertical deviations.

It will thus be seen that the present invention does indeed provide a new and improved alignment system for use with lithographic projection systems. Although specific embodiments have been illustrated and described, it will be obvious to those skilled in the art that various modifications may be made without departing from the spirit and scope of the invention which is to be limited solely by the appended claims.

What is claimed is:

1. An alignment system for use with lithographic projection systems comprising, in combination:
   first indicia disposed on first and second members;
   second indicia disposed on first and second members;
   the space between said indicia when the first indicia of one member is projected onto the second indicia of the other member coarsely indicating the degree of misalignment between said members when making a fine motion alignment measurement;
   a first scale disposed on said first and said second members, a said second scale disposed on said first and said second members;
   each of said scales including a plurality of spaced fingers, all of said fingers being of substantially the same width;
   the pitch of the fingers of one scale being different than the pitch of the fingers on the other scale so that when the first scale of one member is projected onto the second scale of the other member, the pair of fingers which coincide indicates a fine degree of fine motion alignment measurement from an alignment axis; and
   one of said members being a test mask and the other of said members being a wafer-tool.

2. An alignment system according to claim 1 wherein said first member and said second member are in substantially exact alignment when a central finger of said first scale coincides with a central finger of the second scale along said aligment axis.

3. An alignment system according to claim 1 wherein said first member and said second member are in substantially exact alignment when said first indicia is in alignment with said second indicia along said alignment axis and a central finger of the first scale coincides with a central finger of the second scale along said alignment axis.

4. An alignment system for use with lithographic projection systems comprising, in combination:
   first indicia disposed on a first and second members;
   second indicia disposed on said first and said second members;
   third indicia disposed on said first and said second members;
   fourth indicia disposed on said first and said second members;
   the space between the first and second indicia when the first indicia of one member is projected onto the second indicia of the other member coarsely indicating the degree of horizontal misalignment between said members when making a fine motion alignment measurement, and the spacing between said third and fourth indicia when the third indicia of one member is projected onto the fourth indicia of the other member coarsely indicating the degree of vertical misalignment between said members when making a fine motion alignment measurement;
   a first scale disposed on said first and said second members;
   a second scale disposed on said first and said second members;
   a third scale disposed on said first and said second members;
   a fourth scale disposed on said first and said second members;
   each of said scales including a plurality of spaced fingers, all of the fingers on the first and second scales being of substantially the same width, all the fingers on said third and fourth scales being of substantially the same width;
   the pitch of the fingers of the first scale being different than the pitch of the fingers on the second scale so that when the first scale on one member is projected onto the second scale on the other member, the pair of fingers which coincide indicates a fine degree of fine motion horizontal alignment measurement from a first alignment axis, and the pitch of the fingers of the third scale being different than the pitch of the fingers on the fourth scale so that when the third scale on one member is projected onto the fourth scale of the other member the pair of fingers which coincide indicates a fine degree of fine motion vertical alignment measurement from a second alignment axis;
   one of said members being a test mask and the other of said members being a wafer-tool.

5. An alignment system according to claim 4 wherein said first member and said second member are in substantially exact alignment in the horizontal direction when a central finger of said first scale coicides with a central finger of the second scale along said first alignment axis, and wherein said first member and said second are in substantially exact alignment in the vertical direction when a central finger of said third scale coincides with a central finger of the fourth scale along said second alignment axis.

6. An alignment system according to claim 4 wherein said first member and said second member are in substantially exact alignment in the horizontal direction when said first indicia is in alignment with said second indicia along said first alignment axis and a central finger of the first scale coincides with a central finger of the second scale along said first alignment axis, and wherein said first member and said second member are in substantially exact alignment in the vertical direction when said third indicia is in alignment with said fourth indicia along said second alignment axis and a central finger of the third scale coincides with a central finger of the fourth scale along said second alignment axis.

7. A method of aligning a first member with respect to a second spaced member, one of said members being a test mask and the other of said members being a wafer-tool mounted in a lithographic projection system, said method comprising the steps of:
   observing first indicia on said first and said second member;
   observing second indicia on said first and said second member;
   measuring the spacing between said first indicia and said second indicia to coarsely indicate the degree of misalignment between said members;
   observing a first scale disposed on said first member and said second member;
   observing a second scale disposed on said first member and said second member;

each of said first and said second scales including a plurality of spaced fingers, all of said fingers being of substantially the same width, the pitch of the fingers of said first scale being different than the pitch of the fingers on said second scale;

observing the pair of fingers which coincide to thereby determine a fine degree of misalignment from an alignment axis.

* * * * *